(12) United States Patent
Honda

(10) Patent No.: US 8,035,459 B2
(45) Date of Patent: Oct. 11, 2011

(54) WIDEBAND DIVIDER

(75) Inventor: Yuuri Honda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 300 days.

(21) Appl. No.: 12/358,600

(22) Filed: Jan. 23, 2009

(65) Prior Publication Data

US 2010/0188162 A1   Jul. 29, 2010

(30) Foreign Application Priority Data

Jan. 23, 2008 (JP) ................... 2008-012676

(51) Int. Cl.
*H01P 5/12* (2006.01)
*H03F 3/68* (2006.01)
(52) U.S. Cl. ................ 333/100; 333/124; 330/295
(58) Field of Classification Search .......... 333/100, 333/124; 330/124 R, 295, 84, 301, 283; 327/415–417
See application file for complete search history.

(56) References Cited

U.S. PATENT DOCUMENTS

| 5,045,822 | A | 9/1991 | Mohwinkel | |
| 7,227,418 | B2 * | 6/2007 | Makioka | 330/295 |
| 7,489,197 | B2 * | 2/2009 | Nilsson | 330/295 |
| 7,626,457 | B2 * | 12/2009 | Mudd et al. | 330/254 |
| 7,755,430 | B2 * | 7/2010 | Imagawa | 330/295 |
| 2006/0044067 | A1 * | 3/2006 | Suzaki et al. | 330/295 |

FOREIGN PATENT DOCUMENTS

JP    10-022746    1/1998

* cited by examiner

*Primary Examiner* — Robert Pascal
*Assistant Examiner* — Alan Wong
(74) *Attorney, Agent, or Firm* — Young & Thompson

(57) ABSTRACT

A power divider includes first and second amplifiers (AMP1, AMP2), and an isolation circuit. AMP1 includes a first capacitor (C1) with one end connected to input, a first FET (FET1) having a gate connected to the other end of C1, a first feedback circuit connecting the FET1 drain and the one end of C1, a first source circuit connecting the FET1 source and ground, and a second capacitor connecting the FET1 drain and a first output. AMP2 includes a third capacitor with one end connected to input, a second FET (FET2) having a gate connected to the other end of the third capacitor, a second feedback circuit connecting the FET2 drain and the one end of the third capacitor, a second source circuit connecting the FET2 source and ground, and a fourth capacitor connecting the FET2 drain and a second output. The isolation circuit connects the FET1 and FET2 sources.

9 Claims, 9 Drawing Sheets

US 8,035,459 B2

WIDEBAND DIVIDER

REFERENCE TO RELATED APPLICATION

This application is based upon and claims the benefit of the priority of Japanese patent application No. 2008-012676 filed on Jan. 23, 2008, the disclosure of which is incorporated herein in its entirety by reference thereto.

FIELD OF THE INVENTION

The present invention relates to a power divider. More specifically, the invention relates to a wideband power divider.

DESCRIPTION OF RELATED ART

When a plurality of receivers are operated by one system signal, an input signal needs to be branched into a plurality of outputs. In order to improve receiving sensitivity of each receiver as well, a low loss and smaller size is demanded of a divider that branches the input signal into the plurality of outputs. In order to achieve the smaller size, it is important to integrate the divider into a chip. Further, a frequency range of each branched signal in the divider must be sufficiently wide to be from 55 MHz to 860 MHz in the case of a CATV (Community Antenna Television), for example, Further, impedance matching between input and outputs, and isolation between the outputs are also important.

As a related art of the divider for satisfying such characteristics, a circuit configuration is disclosed in Patent Document 1 (U.S. Pat. No. 5,045,822), in which two or more FETs (Field Effect Transistors; field effect transistors) are employed. In this circuit configuration, an input terminal is connected to gate terminals of the two FETs, and drains of the FETs are connected to output terminals, thereby forming one-input and multiple-branch circuit. In this circuit, the drains of the FETs are connected by a resistor. A feedback path is included between a gate and the drain of each FET, and a source of each FET is connected to the GND. When the other output terminal is seen from one output terminal, a signal that passes through the gate to drain of the other FET through a feedback resistor is 180° phase shifted from a signal that passes through the resistor that connects the drains of the FETs. Amplitudes of the signals are mutually equal. Thus, the signals that appear on the other output terminal are canceled. Thus, isolation between the output terminals becomes satisfactory, and this signal cancellation occurs over a wide frequency band.

FIG. 9 is a diagram showing the circuit configuration (refer to Patent Document 1) for improving the isolation between the output terminals in a wideband divider. A splitter circuit 30 includes a power divider subcircuit 32 and an impedance (output interport impedance: output interport impedance) circuit 24 between outputs. Power supplied on an input port 36 is first coupled to a reference voltage through a capacitor C provided between the ground GND and the input port. The input port is simultaneously connected to gates of FETs Q1 and Q2 via an inductor L1. Drain terminals of the FETs with sources thereof connected to the ground GND are connected to an output port 38 and an output port 20, respectively. The drain and gate of each of the FETs Q1 and Q2 are connected by feedback circuits 21 and 23. These impedances respectively including a series connection of a resistor R1 and an inductor L2 and a series connection of a resistor R2 and an inductor L3 provide input/output impedance matching and gain compensation, in conjunction with the associated FETs.

The output ports 38 and 20 are directly connected by an impedance circuit 24 between the output ports 38 and 20. Preferably, this impedance circuit 24 is a series connection of a resistor R3 and an inductor L4.

Isolation between the output ports 38 and 20 is important for power dividers or power splitters. With the use of active devices such as the FETs Q1 and Q2, a reflected wave on the output port 38 passes through the FET Q1 by the capacitive divider between the drain and gate and between the gate and ground. This un-phase-shifted signal then feeds directly through the other FET Q2, and in doing so, undergoes approximately a 180° phase shift. This signal appears on the other output port 20. In the circuit in FIG. 9, degradation in isolation between the output ports is thereby seen.

Additional signal degradation occurs in the splitter circuit 30 through the impedance (output interport impedance) circuit 24. In the most simple form, this (output interport impedance) circuit 24 would consist of the resistor R3 alone. The signal on the output port 38 is thus fed, without phase shift, through the resistor R3 to the output port 20. The signals of the same signal strength traveling on two different paths that are mutually different in phase by 180° are combined at the output port 20. Thus, the cancellation occurs, thereby producing decrease in the resultant signal on the output port 20.

Assume that the phase of the signal passing through the FETs has actually advanced substantially by more than 180°. The offset in phase shift from 180° is compensated for by the inductor L4 that constitutes the impedance (output interport impedance) circuit 24 so that a phase shift between the two paths is 180°.

Patent Document 2 discloses a wideband amplifier capable of amplifying a signal over a multi-channel wideband such as in the case of CATV, stably and with a high gain. Between a power divider connected to an input terminal and a power coupler connected to an output terminal, push-pull connected first and second amplifier circuits are included. In each amplifier circuit, while a first-stage amplifier portion that constitutes an input side and a second-stage amplifier portion are cascade connected, the second-stage amplifier portion and a third-stage amplifier portion that constitutes an output side are cascode connected. Further, a first feedback circuit is connected between an input side of the second-stage amplifier portion and an input side of the first-stage amplifier portion. A second feedback circuit is connected between an output side of the third-stage amplifier portion and the input side of the second-stage amplifier portion. In Patent Document 2, the power divider includes an input side transformer, while the power coupler includes an output side transformer.

[Patent Document 1] U.S. Pat. No. 5,045,822
[Patent Document 2] JP Patent Kokai Publication No. JP-A-10-22746

SUMMARY OF THE DISCLOSURE

The entire disclosures of Patent Documents 1 and 2 are incorporated herein by reference thereto.

The following analysis of the related art is given by the present invention.

The related art described with reference to FIG. 9 has the following problem.

When an ESD (Electro Static Discharge) or a large signal is supplied to one of the output terminals, or when the large signal is handled, the resistor that connects the output terminals (resistor R3 of the impedance circuit 24 in FIG. 9) would be weak or small.

Further, with this circuit, the output terminals cannot sufficiently be isolated.

Further, when circuit parameters are adjusted so as to improve the isolation, a gain between the input and output terminals is reduced, and the bandwidth becomes narrower.

The present invention, which seeks to solve one or more of the above, is generally configured as follows.

According to one aspect of the present invention, there is provided a divider circuit including: a plurality of FETs each with a gate thereof AC connected to a common input terminal, and having a drain thereof AC connected to a corresponding one of a plurality of output terminals; and a feedback circuit connected between the drain and the gate of each of FETs; a source of one of the FETs being connected to a source of an other one of the FETs via a resistor or a series circuit of a resistor and an inductor.

The divider circuit of the present invention further includes: a capacitor and a resistor connected in series between the drain of the one of the FETs and the source of the other one of the FETs. The divider circuit of the present invention further includes: a capacitor and a resistor connected in series between the source of the one of the FETs and the drain of the other one of the FETs.

According to another aspect of the present invention, there is provided a divider circuit including: a plurality of FETs each with a gate thereof connected to a common input terminal via a capacitor, with a drain thereof connected to a corresponding one of a plurality of output terminals via a capacitor, with a feedback circuit connected between the drain and the gate thereof, and with a parallel circuit connected between a source thereof and a ground, the parallel circuit including a resistor and a series circuit of an inductor and a resistor; the drain of one of the FETs being connected to the drain of an other one of the FETs via a resistor or a series circuit of a resistor and an inductor.

According to still another aspect of the present invention, there is provided a divider circuit including: a plurality of FETs each with a gate thereof connected to a common input terminal via a capacitor, with a drain thereof connected to a corresponding one of a plurality of output terminals via a capacitor, and with a feedback circuit connected between the drain and the gain thereof; a series circuit of a capacitor and a resistor between the drain of one of the FETs and a source of an other one of the FETs; and a series circuit of a capacitor and a resistor between a source of the one of the FETs and the drain of the other one of the FETs; the drain of the one of the FETs being connected to the drain of the other one of the FETs via a resistor or a series circuit of a resistor and an inductor.

The present invention can provide a wideband divider having a small number of circuit elements in which, even if a high voltage has been supplied to an output terminal, an influence caused by the supply of the high voltage can be reduced more, and includes an isolation characteristic over a wide bandwidth.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 8A and 8B are graphs of which FIG. 8B shows an isolation characteristic in the second embodiment of the present invention.

PREFERRED MODES OF THE INVENTION

Figure 1:
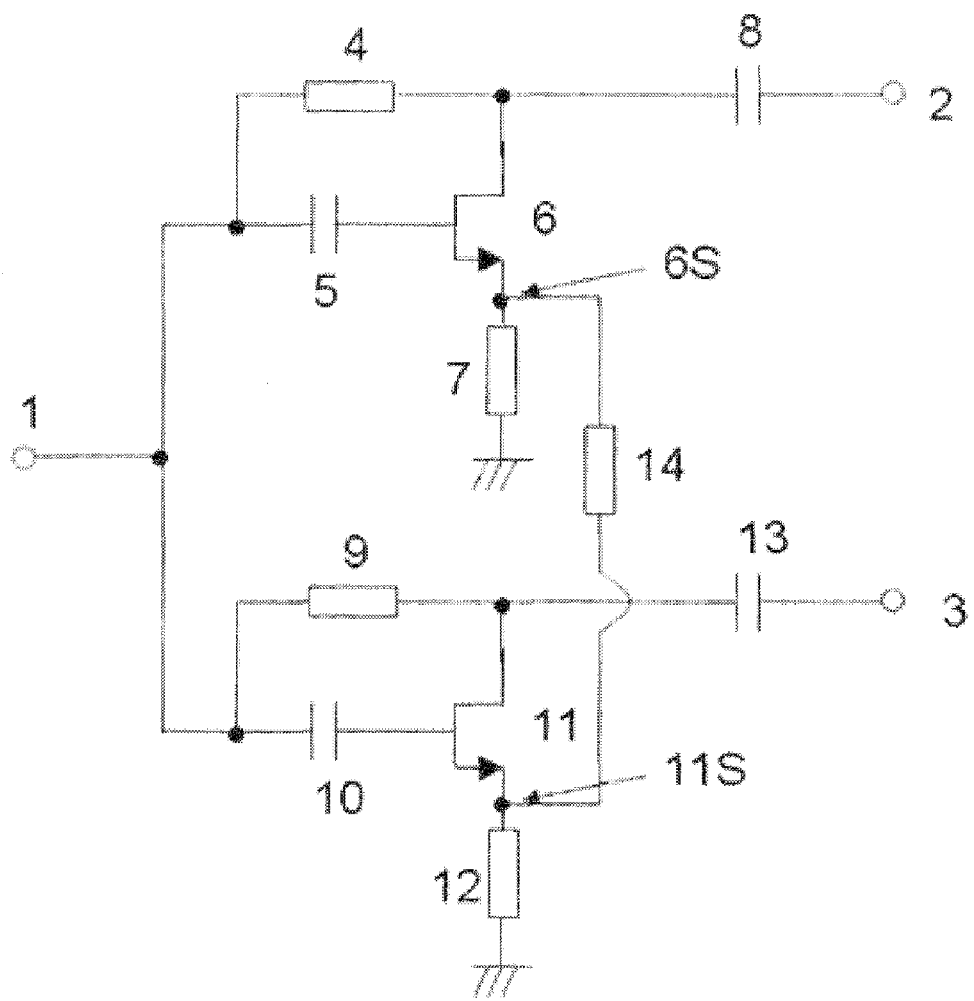
FIG. 1 is a diagram showing a configuration of a first embodiment of the present invention.

In an exemplary embodiment of the present invention, there is provided a first amplifier, a second amplifier, and an isolation circuit (14). The first amplifier includes a first capacitor (5) having one end thereof connected to an input terminal (1), a first FET (6) having a gate terminal connected to the other end of the first capacitor (5), a first feedback circuit (4) connected between a drain terminal of the first FET (6) and the one end of the first capacitor (5), a first source circuit (7) connected between a source terminal of the first FET (6) and the ground, and a second capacitor (8) connected between the drain terminal of the first FET (6) and a first output terminal (2). The second amplifier includes a third capacitor (10) having one end thereof connected to the input terminal (1), a second FET (11) having a gate terminal connected to the other end of the third capacitor (10), a second feedback circuit (9) connected between a drain terminal of the second FET (11) and the one end of the third capacitor (10), a second source circuit (12) connected between a source terminal of the second FET (11) and the ground, and a fourth capacitor (13) connected between the drain terminal of the second FET (11) and a second output terminal (3). The isolation circuit (14) is connected between sources of the first FET (6) and the second FET (11).

In another exemplary embodiment of the present invention, there are provided a capacitor (18) and a resistor (17) connected in series between a source of a first FET (6) and a drain of a second FET (11) and a capacitor (15) and a resistor (16) connected in series between a drain of the first FET (6) and a source of the second FET (11).

In another exemplary embodiment of the present invention, there are provided a first amplifier, a second amplifier, and an isolation circuit (14). The first amplifier includes a first capacitor (5) having one end thereof connected to an input terminal (1), a first FET (6) having a gate terminal connected to the other end of the first capacitor, a first feedback circuit (4) connected between a drain terminal of the first FET (6) and the one end of the first capacitor (5), a first resistor (7c) connected between a source terminal of the first FET (6) and the ground, a series circuit of a second resistor (7b) and a first inductor (7a) connected in parallel with the first resistor (7c), and a second capacitor (8) connected between a drain terminal of the first FET (6) and a first output terminal. The second amplifier includes a third capacitor (10) with one end thereof connected to the input terminal (1), a second FET (11) having a gate terminal connected to the other end of the third capacitor (10), a second feedback circuit (9) connected between a drain terminal of the second FET (11) and the one end of the third capacitor (10), a third resistor (12c) connected between a source terminal of the second FET (11) and the ground, and a series circuit of a fourth resistor (12b) and a second inductor (12a) connected in parallel with the third resistor (12c), and a fourth capacitor (13) connected between the drain terminal of the second FET (11) and a second output terminal. The isolation circuit (14) is connected between drains of the first FET (6) and the second FET (11).

In another exemplary embodiment of the present invention, there are provided a first amplifier, a second amplifier, an isolation circuit (14), a capacitor (18) and a resistor (17), and a capacitor (15) and a resistor (16). The first amplifier includes a first capacitor (5) having one end thereof connected to an input terminal (1), a first FET (6) having a gate terminal connected to the other end of the first capacitor (5), a first feedback circuit (4) connected between a drain terminal of the first FET and the one end of the first capacitor (5), a first source circuit (7) connected between a source terminal of the first FET (6) and the ground, and a second capacitor (8) connected between the drain terminal of the first FET (6) and a first output terminal (2). The second amplifier includes a third capacitor (10) having one end thereof connected to the input terminal (1), a second FET (11) having a gate terminal connected to the other end of the third capacitor (10), a second feedback circuit (9) connected between a drain terminal of the second FET (11) and the one end of the third capacitor (10), a second source circuit (12) connected between a source terminal of the second FET (11) and the ground, and a fourth capacitor (13) connected between the drain terminal of the second FET (11) and a second output terminal (3). The isolation circuit (14) is connected between drains of the first FET (6) and the second FET (11). The capacitor (18) and the resistor (17) are connected in series between a source of the first FET (6) and the drain of the second FET (11). The capacitor (15) and the resistor (16) are connected in series between the drain of the first FET (6) and a source of the second FET (11). A description will be given below in connection with example.

FIG. 1 is a diagram showing a configuration of a first example of the present invention. A circuit configuration of a one-input two-output type power divider is shown. Referring to FIG. 1, the power divider in this example includes capacitors 5 and 10, FETs 6 and 11, feedback circuits 4 and 9, source circuits 7 and 12, capacitors 8 and 13, and an isolation circuit 14. One end of each of the capacitors 5 and 10 is connected to an input terminal 1. Gate terminals of the FETs 6 and 11 are connected to the other ends of the capacitors 5 and 10, respectively. The feedback circuit 4 is connected between a drain terminal of the FET 6 and the one end of the capacitor 5. The feedback circuit 9 is connected between a drain terminal of the FET 11 and the one end of the capacitor 10. The source circuit 7 is connected between a source terminal of the FET 6 and the ground GND. The source circuit 12 is connected between a source terminal of the FET 11 and the ground GND. The capacitor 8 is connected between the drain terminal of the FET 6 and an output terminal 2. The capacitor 13 is connected between the drain terminal of the FET 11 and an output terminal 3. The isolation circuit 14 is connected between the source terminals of the FETs 6 and 11. Each of the feedback circuits 4 and 9 includes a resistor or a series circuit of a resistor and an inductor. Each of the source circuits 7 and 12 includes a resistor. The isolation circuit 14 includes a resistor or a series circuit of a resistor and an inductor.

As paths from the output terminal 2 to the output terminal 3 in this example, there are two paths as follows:

Path A: [Output Terminal 2]→[Capacitor 8]→[Feedback Circuit 4]→[Capacitor 10]→[Gate to Drain of FET 11]→[Capacitor 13]→[Output Terminal 3]

Path B: [Output Terminal 2]→[Capacitor 8]→[Drain to Source of FET 6]→[Isolation Circuit 14]→[Source to Drain of FET 11]→[Capacitor 13]→[Output Terminal 3]

Phases of the two paths A and B are shifted to each other by 180°. Thus, at the output terminal 3 where the two paths A and B cross each other, signal cancellation occurs. A good isolation characteristic can be thereby obtained.

Figure 9:
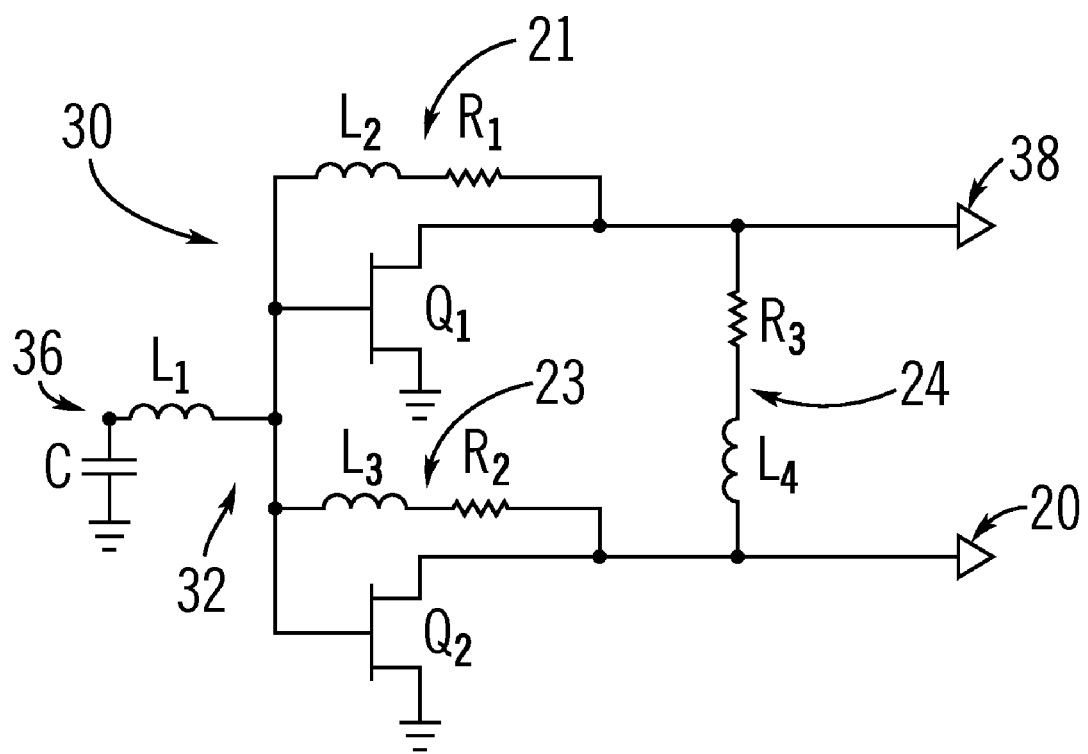
FIG. 9 is a diagram showing a circuit configuration of a related art (in Patent Document 1).

Assume that an ESD pulse has been applied to the output terminal 2 in this example. Then, since the isolation circuit 14 is connected between the source terminals of the FETs 6 and 11, the isolation circuit 14 is protected more than in a case where an isolation circuit is connected between the drains of FETs as in a configuration in FIG. 9.

Assume that a large signal is handled. When phases of voltage amplitudes at the output terminals 2 and 3 are shifted due to routing of lines in the circuit, the capacitance between the line and the ground, for example, a large current will flow through an (output interport impedance) circuit 24 in the circuit in FIG. 9.

On contrast therewith, even if phases of voltage amplitudes at the output terminals 2 and 3 have been shifted in this example, the isolation circuit 14 is connected to the source terminals of the FETs 6 and 11. Thus, voltage amplitudes that are sufficiently smaller than the voltage amplitudes that appear at the output terminals 2 and 3 appear at the source terminals. Accordingly, even if the phases of the voltage amplitudes at the output terminals 2 and 3 have been shifted, a large current is difficult to flow through the isolation circuit 14.

Figure 2:
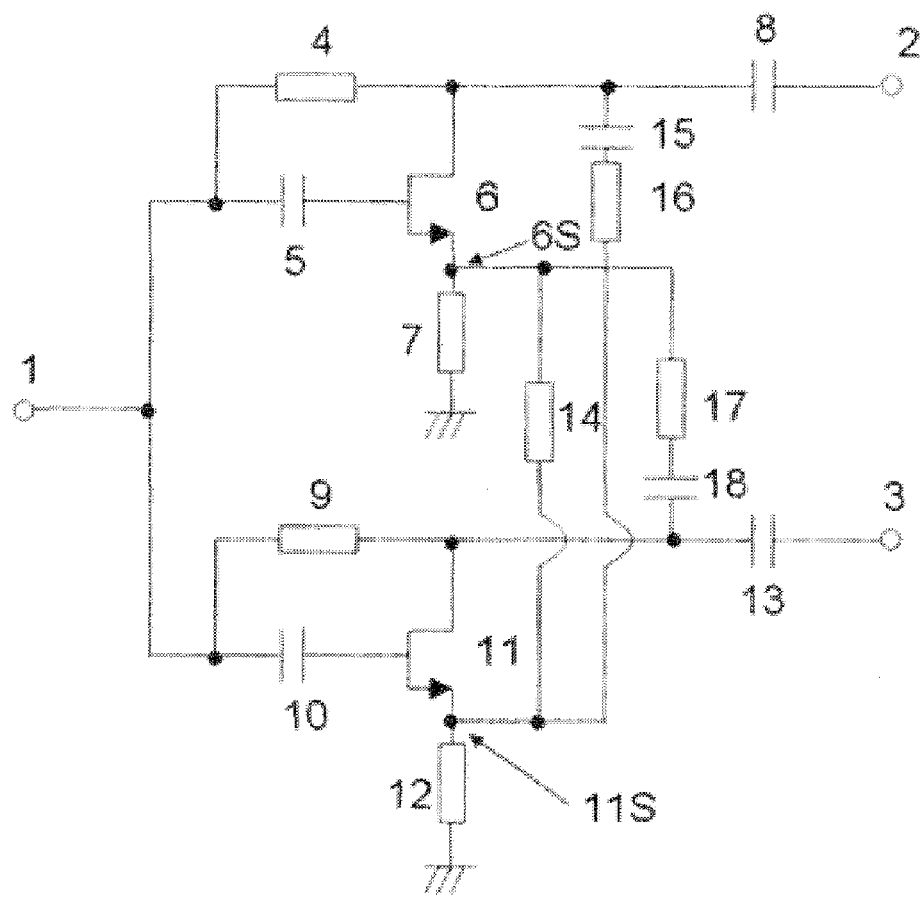
FIG. 2 is a diagram showing a configuration of a second embodiment of the present invention.

FIG. 2 is a diagram showing a configuration of a second example of the present invention. This example aims to further improve isolation between output terminals and increase the bandwidth of a gain characteristic. Referring to FIG. 2, a power divider in this example is obtained by further connecting a series circuit including a capacitor 15 and a circuit (resistor) 16 between the drain terminal of the FET 6 and a source terminal 11S of the FET 11 and connecting a series circuit including a capacitor 18 and a circuit (resistor) 17 between the drain terminal of the FET 11 and a source terminal 6S of the FET 6 in the configuration in FIG. 1.

In paths to an output terminal 3 seen from an output terminal 2, the phase of a path A ([Output Terminal 2]→[Capacitor 8]→[Feedback Circuit 4]→[Capacitor 10]→[Gate to Drain of FET 11]→[Capacitor 13]→[Output Terminal 3]) is further increased from 180° with an increase in frequency due to a gate-drain phase characteristic of the FET 11.

On contrast therewith, a change in the phase of a path B ([Output Terminal 2]→[Capacitor 8]→[Drain to Source of FET 6]→[Isolation Circuit 14]→[Source to Drain of FET 11]→[Capacitor 13]→[Output Terminal 3]) is smaller than in the path A even with an increase in frequency. For this reason, phase cancellation at the output terminal 3 is not exactly performed with the increase in frequency.

Referring to FIG. 2, the following path is added:

Path C: [Output Terminal 2]→[Capacitor 8]→[Capacitor 15]→[Circuit 16]→[Source to Drain of FET 11]→[Capacitor 13]→[Output Terminal 3]. The series circuit including the capacitor 15 and the circuit 16 adjusts phase and loss characteristics of this path with respect to frequency. The series circuit makes this adjustment so that signal cancellation occurs at the output terminal 3, even when the frequency increases, a phase difference between the two paths A and B becomes larger than 180°, and phase cancellation is difficult to occur. As a result, according to this example, an isolation characteristic over a wider bandwidth than in the first example can be obtained.

Further, this series circuit including the capacitor 15 and the circuit 16 leads to a wider bandwidth of a gain characteristic. That is, a source resistance of the FET 11 is formed by a parallel circuit including a source circuit 12 and a series resistor including the isolation circuit 14 and a source circuit 7 of the FET 6. When the frequency is increased, a series circuit of the circuit 16 and the capacitor 15, the capacitor 8, and the output terminal 2 with an output impedance (75Ω) is connected in parallel with the parallel circuit including the source circuit 12 and the series resistor including the isolation circuit 14 and the source circuit 7 of the FET 6. The impedance of the source of the FET 11 is thus reduced more at high frequency than at low frequency. Since the gain characteristic is reduced at high frequency, the bandwidth of the gain characteristic can be increased by the circuit configuration in this example.

Figure 3:
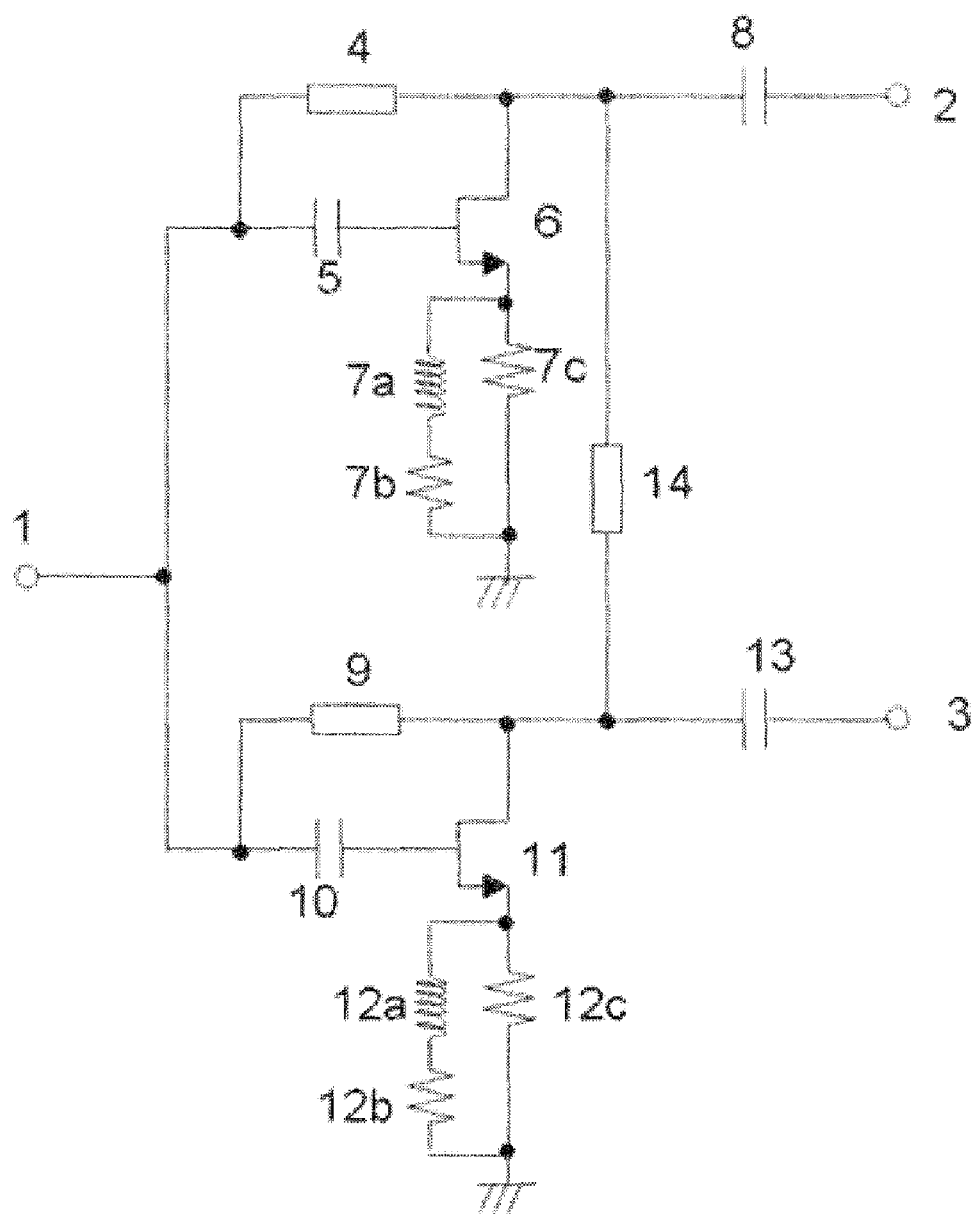
FIG. 3 is a diagram showing a configuration of a third embodiment of the present invention.

FIG. 3 is a diagram showing a configuration of a third example. This example shows a circuit for further improving isolation between output terminals. The circuit in this example is a one-input two-output type circuit. Referring to FIG. 3, the source circuit 7 in FIG. 1 includes a resistor 7c and a series circuit of an inductor 7a and a resistor 7b connected in parallel with the resistor 7c. The resistor 7c is connected between the source terminal of the FET 6 and the ground GND. The source circuit 12 in FIG. 1 includes a resistor 12c and a series circuit of an inductor 12a and a resistor 12b connected in parallel with the resistor 12c. The resistor 12c is connected between the source terminal of the FET 11 and the ground GND. Further, the isolation circuit 14 is connected between the drain terminals of the FETs 6 and 11. The isolation circuit 14 includes a resistor or a series circuit of a resistor and an inductor.

With respect to signals that will pass through an output terminal 3 as seen from an output terminal 2, phases of the following two paths of the signals are shifted to each other by 180°. Phase cancellation thereby occurs, and then signal cancellation occurs.

Path D: [Output Terminal 2]→[Capacitor 8]→[Feedback Circuit 4]→[Capacitor 10]→[Gate to Drain of FET 11]→[Capacitor 13]→[Output Terminal 3]

Path E: [Output Terminal 2]→[Capacitor 8]→[Isolation Circuit 14]→[Capacitor 13]→[Output Terminal 3]

In the first example in FIG. 1, the phase of the path that passes through [Output Terminal 2]→[Capacitor 8]→[Feedback Circuit 4]→[Capacitor 10]→[Gate to Drain of FET 11] becomes larger than −180° at high frequency due to a gate-to-drain frequency characteristic of the FET 11.

In this example in FIG. 3, a parallel circuit including the resistor 12c and the series circuit of the inductor 12a and the resistor 12b is connected to the source of the FET 11. Thus, the phase of the source of the FET 11 gradually advances at high frequency, and can reduce a gate-drain characteristic variation of the FET 11 at the high frequency. As a result, phase cancellation can be realized even at the high frequency.

Figure 4:
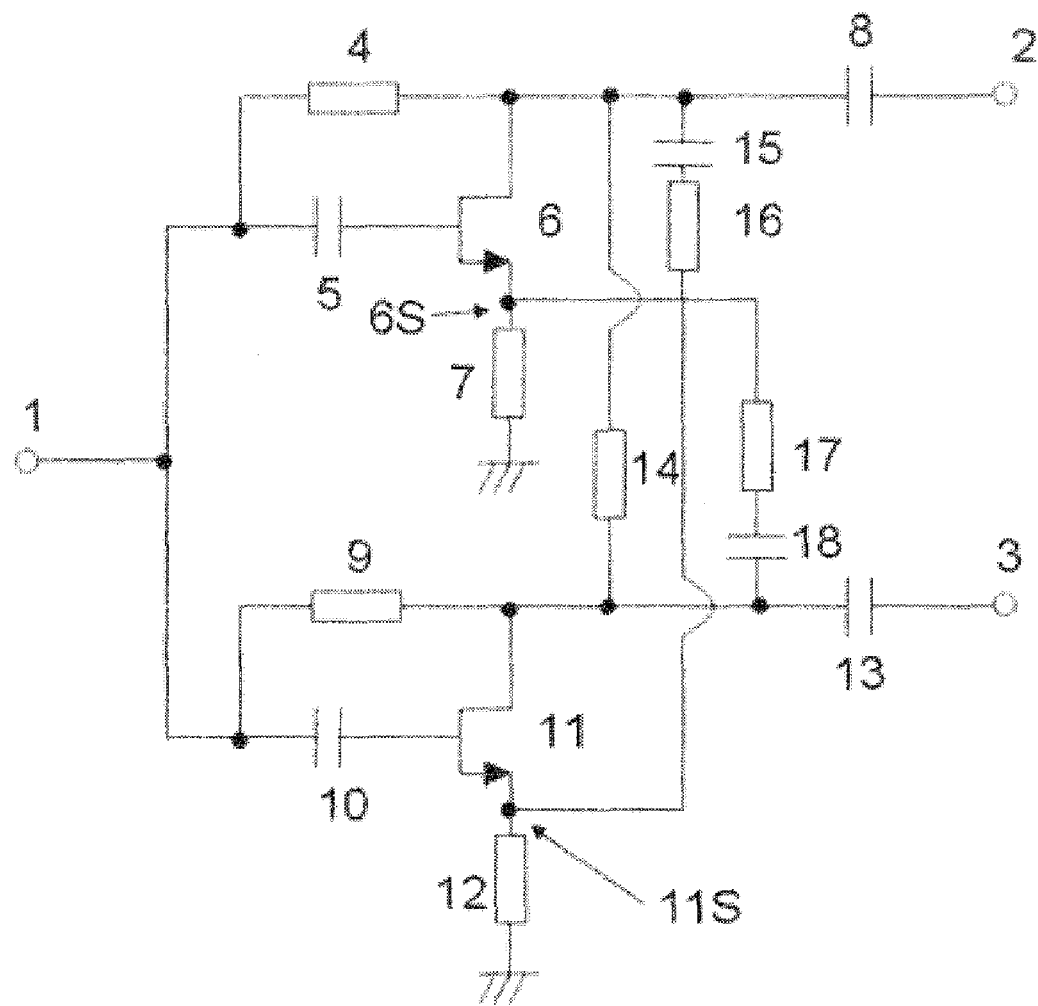
FIG. 4 is a diagram showing a configuration of a fourth embodiment of the present invention.

FIG. 4 is a diagram showing a configuration of a fourth example of the present invention. This example further improves an isolation characteristic between output terminals. In the second example in FIG. 2, the isolation circuit 14 is connected between the source terminal 6S of the FET 6 and the source terminal 11S of the FET 11. In this example, an isolation circuit 14 is connected between drain terminals of FETs 6 and 11.

A value of a series circuit including a capacitor 15 and a circuit 16 provided between the drain terminal of the FET 6 and a source terminal of the FET 11 is adjusted so that a phase difference between two paths when an output terminal 3 is seen from an output terminal 2 further becomes larger than 180°, and phase cancellation occurs at a frequency where the phase cancellation is difficult to occur. The isolation characteristic can be thereby obtained over a wide bandwidth.

As in the second example in FIG. 2, the series circuit including the capacitor 15 and the circuit 16 and a series circuit including a capacitor 18 and a circuit 17 can increase the bandwidth of a gain characteristic when the output terminal 2 or the output terminal 3 is seen from an input terminal 1, as well.

Figure 5:
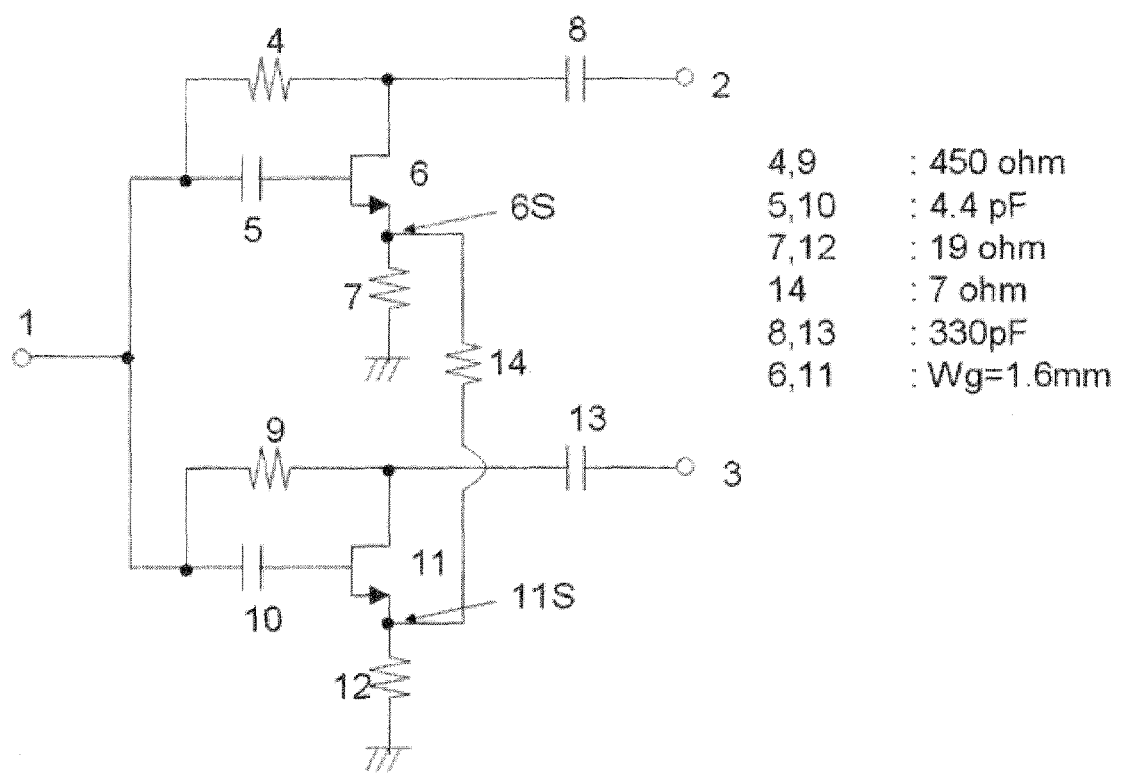
FIG. 5 is a diagram showing a specific example of the first embodiment of the present invention.

A specific example will be described below. In this specific example, the feedback circuit 4 in the first example in FIG. 1 includes a series circuit of a resistor or a resistor and an inductor. The source circuit 7 includes a resistor. Then, the isolation circuit 14 includes a series circuit on a micro-strip line, including a resistor, or a resistor and an inductor. FIG. 5 shows the circuit and parameters of the circuit.

resistors 4 and 9: 450 ohm
capacitors 5 and 10: 4.4 pF
resistors 7 and 12: 19 ohm
resistor 14: 7 ohm
capacitors 8 and 13: 330 pF
FETs 6 and 11: Wg (Gate Width)=1.6 mm The circuit parameters in FIG. 5 are just an example, and values of the circuit parameters are adjusted if necessary based on a mechanism for phase cancellation which will be described below. Thus, it is common that a plurality of combinations of the circuit parameters are present.

As described above, as the paths from the output terminal 2 to the output terminal 3 in FIG. 1, the following paths are provided:

Path A: path that passes through [Output Terminal 2]→[Capacitor 8]→[Feedback Circuit 4]→[Capacitor 10]→[Gate to Drain of FET 11]→[Capacitor 13]→[Output Terminal 3]

Path B: path that passes through [Output Terminal 2]→[Capacitor 8]→[Drain to Source of FET 6]→[Isolation Circuit 14]→[Source to Drain of FET 11]→[Capacitor 13]→[Output Terminal 3]

The path B is the one which passes through the drain to the source of the FET 6 and the source to the drain of the FET 11. Thus, the phase of a signal that appears at the output terminal 3 may be regarded as substantially 0°.

In the path A, a signal passes through the gate to the drain of the FET 11. Thus, the phase of the signal is delayed from an original signal by substantially 180°.

Figure 6:
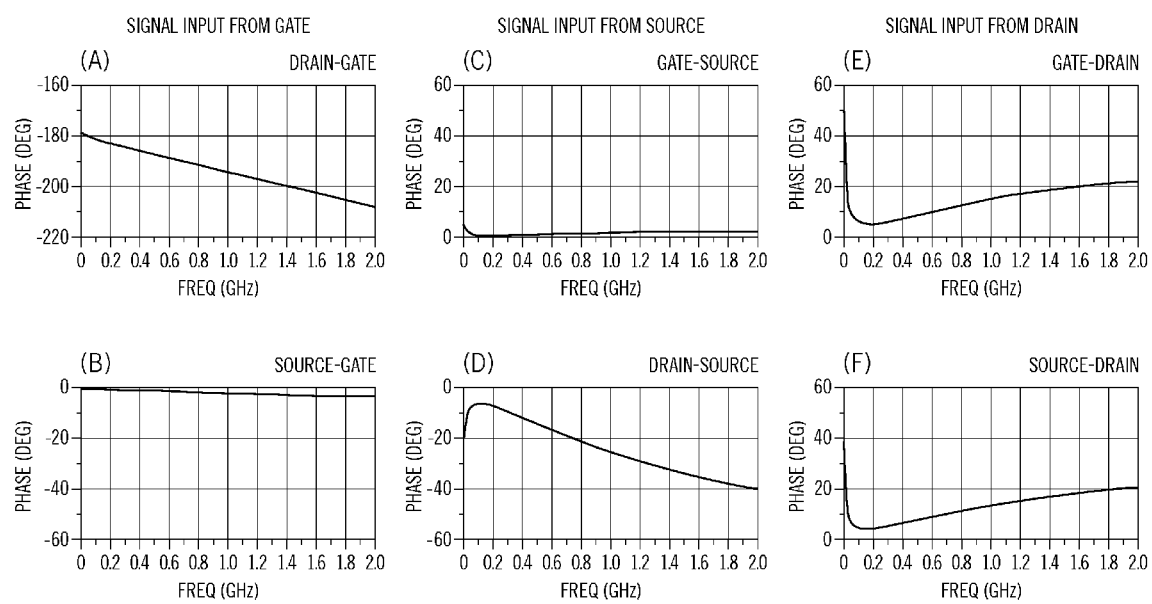
FIG. 6 shows graphs each showing a phase difference between terminals of an FET.

A gate-drain phase shift and a gate-source phase shift at a time of signal input from gate will be shown in (A) and (B) of FIG. 6, respectively.

A source-gate phase shift and a source-drain phase shift at a time of signal input from source will be shown in (C) and (D) of FIG. 6, respectively.

A drain-gate phase shift and a drain-source phase shift at a time of signal input from drain will be shown in (E) and (F) and FIG. 6, respectively.

Figure 7:
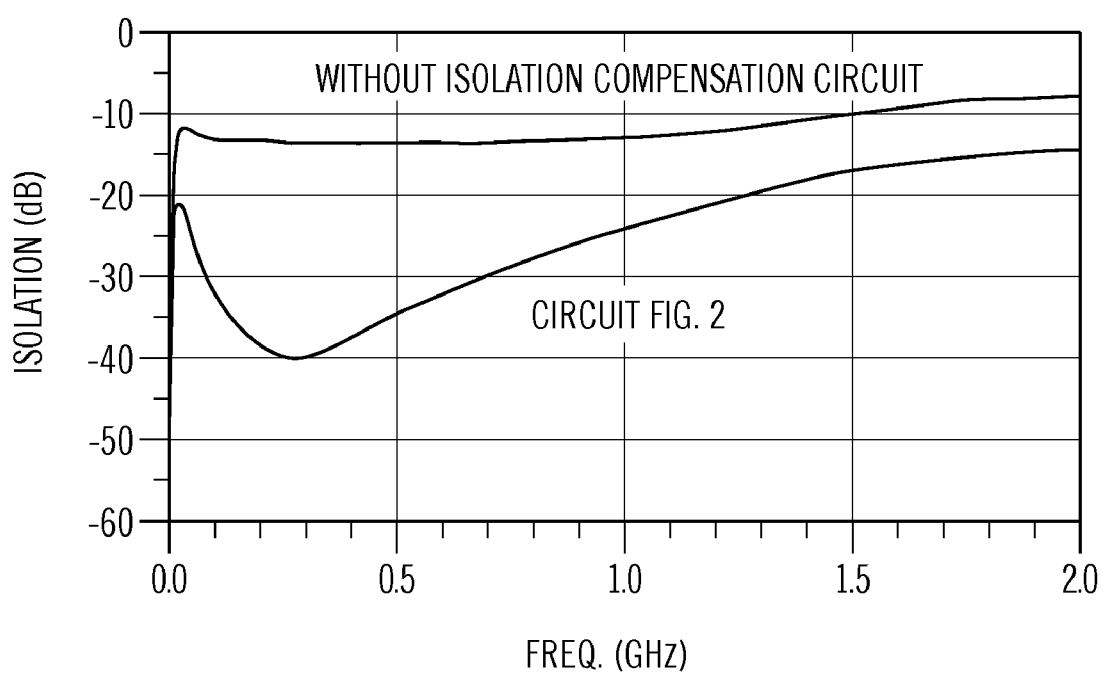
FIG. 7 is a graph showing an isolation characteristic in the first embodiment of the present invention.

The two signals that have passed through these two paths are synthesized at the output terminal 3. Thus, the signals are canceled as a result. A good isolation characteristic can be thereby obtained. An effect to be obtained is the same as in a conventional circuit. However, a difference between this example and the conventional circuit is that a circuit for ensuring isolation is connected to the drains of the FETs or the sources of the FETs. An effect when the circuit in FIG. 6 has been applied will be shown in FIG. 7.

As described above, in the configuration of the circuit in FIG. 1, the circuit (isolation circuit 14) for improving the isolation characteristic is connected to the source terminals of the FETs. Assume that an ESD pulse has been supplied to the output terminal 2 or a large signal is handled. Then, when phases of voltage amplitudes at the output terminals 2 and 3 are shifted due to a line run of the circuit or the capacitance between the line and the ground, for example, voltage amplitudes that are sufficiently smaller than the voltage amplitudes that appear at the output terminals 2 and 3 appear at the source terminals of the FETs because the isolation circuit 14 is connected to the source terminals of the FETs. Accordingly, even if the phases of the voltage amplitudes at the output terminals 2 and 3 have been shifted, a large current is difficult to flow through the isolation circuit 14.

Figure 8A:
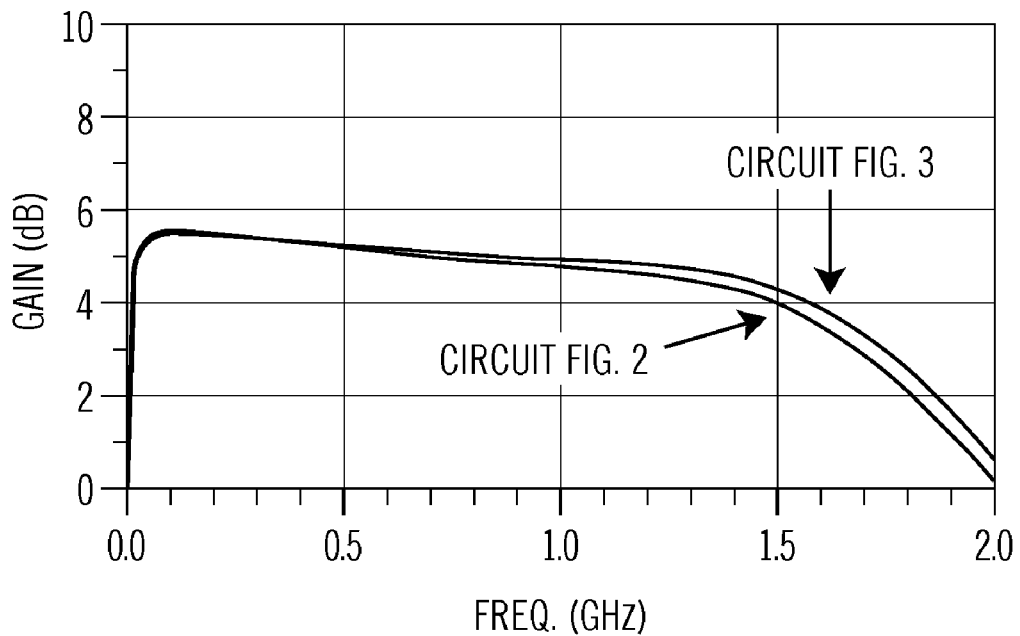
Figure 8B:
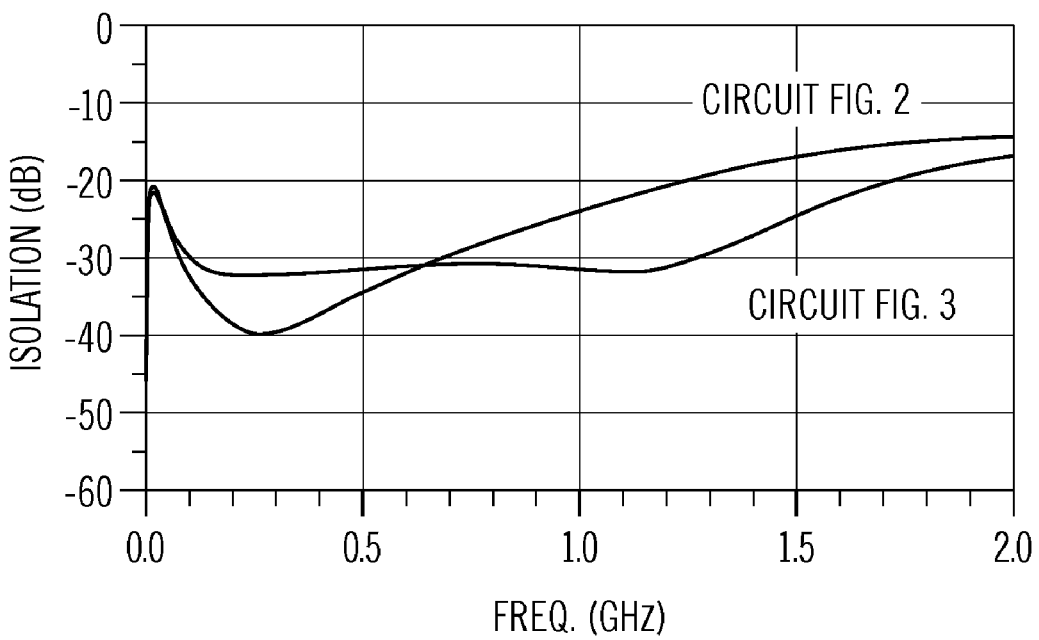

FIGS. 8A and 8B are graphs for explaining an operation and effect of each of the examples in FIGS. 2 and 3. The gain characteristic and the isolation characteristic are respectively shown (in FIG. 8A and in FIG. 8B). FIGS. 8A and 8B are just examples. By arbitrarily changing parameters of the circuit including the capacitor 15 and the circuit 16 and the circuit including the capacitor 18 and the circuit 17 described above, shapes of the gain and isolation characteristics can be freely adjusted.

The series circuit including the capacitor 15 and the circuit 16 in FIG. 2 leads to the wider bandwidth of the gain characteristic. That is, the source resistance of the FET 11 at a sufficiently low frequency is formed by the parallel circuit comprising the source circuit 12 and the series resistor including the isolation circuit 14 and the source circuit 7 of the FET 6. When the frequency is increased, the series circuit of the circuit 16 and the capacitor 15, the capacitor 8, and the output terminal 2 with the output impedance (75Ω) is connected in parallel with this parallel circuit. The impedance of the source of the FET 11 is thus reduced more at high frequency than at low frequency. Since the gain characteristic is reduced at high frequency, the bandwidth of the gain characteristic can be increased by this circuit.

Each disclosure of Patent Documents 1 through 4 described above is incorporated herein by reference. Modifications and adjustments of the exemplary example and the examples are possible within the scope of the overall disclosure (including claims) of the present invention, and further based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A divider circuit comprising:
   an input terminal;
   a plurality of output terminals;
   a plurality of FETs (field effect transistors) having gates connected in common to the input terminal via respective capacitors, and having drains connected to the plurality of output terminals via capacitors, respectively; and
   a plurality of feedback circuits, each of the feedback circuits being connected between the drain and the gate of each of FETs;
   a source of one of the FETs being connected to a source of an other one of the FETs via a resistor or a series circuit of a resistor and an inductor.

2. The divider circuit according to claim 1, further comprising:
   a series circuit of a capacitor and a resistor between the drain of the one of the FETs and the source of the other one of the FETs.

3. The divider circuit according to claim 1, further comprising:
   a series circuit of a capacitor and a resistor between the source of the one of the FETs and the drain of the other one of the FETs.

4. The divider circuit according to claim 1, comprising:
   a first capacitor having one end connected to the input terminal;
   a first FET having a gate terminal connected to the other end of the first capacitor;
   a first feedback circuit connected between a drain terminal of the first FET and the one end of the first capacitor;
   a first source circuit connected between a source terminal of the first FET and a ground;
   a second capacitor connected between the drain terminal of the first FET and a first output terminal;
   a third capacitor having one end connected to the input terminal;
   a second FET having a gate terminal connected to the other end of the third capacitor;
   a second feedback circuit connected between a drain terminal of the second FET and the one end of the third capacitor;
   a second source circuit connected between a source terminal of the second FET and the ground;
   a fourth capacitor between the drain terminal of the second FET and a second output terminal; and
   an isolation circuit connected between a source of the first FET and a source of the second FET.

5. The divider circuit according to claim 4, further comprising:
   a capacitor and a resistor connected in series between the source of the first FET and a drain of the second FET; and
   a capacitor and a resistor connected in series between a drain of the first FET and the source of the second FET.

6. A divider circuit comprising:
   an input terminal;
   a plurality of output terminals;
   a plurality of FETs (field effect transistors) having gates connected in common to the input terminal via respective capacitors, and having drains connected to the plurality of output terminals via capacitors, respectively;
   a plurality of feedback circuits, each of the feedback circuits being connected between the drain and the gate of each of FETs; and
   a plurality of parallel circuits, each of the parallel circuits being connected between a source of each of FETs and a ground, each of the parallel circuits including a resistor and a series circuit of an inductor and a resistor;
   the drain of one of the FETs being connected to the drain of an other one of the FETs via a resistor or a series circuit of a resistor and an inductor.

7. The divider circuit according to claim 6, comprising:
a first capacitor having one end connected to the input terminal;
a first FET having a gate terminal connected to the other end of the first capacitor;
a first feedback circuit connected between a drain terminal of the first FET and the one end of the first capacitor;
a first source circuit including a first resistor and a series circuit of a second resistor and a first inductor connected in parallel with the first resistor, the first resistor being connected between a source terminal of the first FET and a ground;
a second capacitor connected between the drain terminal of the first FET and a first output terminal;
a third capacitor having one end connected to the input terminal;
a second FET having a gate terminal connected to the other end of the third capacitor;
a second feedback circuit connected between a drain terminal of the second FET and the one end of the third capacitor;
a second source circuit including a third resistor and a series circuit of a fourth resistor and a second inductor connected in parallel with the third resistor, the third resistor being connected between a source terminal of the second FET and the ground;
a fourth capacitor between the drain terminal of the second FET and a second output terminal; and
an isolation circuit connected between a drain of the first FET and a drain of the second FET.

8. A divider circuit comprising:
an input terminal;
a plurality of output terminals;
a plurality of FETs (field effect transistors) having gates connected in common to the input terminal via respective capacitors, and having drains connected to the plurality of output terminals via capacitors, respectively;
a plurality of feedback circuits, each of the feedback circuits being connected between the drain and the gate of each of FETs;
a series circuit of a capacitor and a resistor between the drain of one of the FETs and a source of an other one of the FETs; and
another series circuit of a capacitor and a resistor between a source of the one of the FETs and the drain of the other one of the FETs;
the drain of the one of the FETs being connected to the drain of the other one of the FETs via a resistor or a series circuit of a resistor and an inductor.

9. The divider circuit according to claim 8, comprising:
a first capacitor having one end connected to the input terminal;
a first FET having a gate terminal connected to the other end of the first capacitor;
a first feedback circuit connected between a drain terminal of the first FET and the one end of the first capacitor;
a first source circuit connected between a source terminal of the first FET and a ground;
a second capacitor between the drain terminal of the first FET and a first output terminal;
a third capacitor with one thereof connected to the input terminal;
a second FET having a gate terminal connected to the other end of the third capacitor;
a second feedback circuit connected between a drain terminal of the second FET and the one end of the third capacitor;
a second source circuit connected between a source terminal of the second FET and the ground;
a fourth capacitor connected between the drain terminal of the second FET and a second output terminal;
a capacitor and a resistor connected in series between a source of the first FET and a drain of the second FET;
a capacitor and a resistor connected in series between a drain of the first FET and a source of the second FET; and
an isolation circuit connected between the drain of the first FET and the drain of the second FET.

* * * * *